(12) United States Patent
Sakaguchi (10) Patent No.: US 8,754,408 B2
(45) Date of Patent: Jun. 17, 2014

(54) ORGANIC EL ILLUMINATION DEVICE

(75) Inventor: Yoshikazu Sakaguchi, Tokyo (JP)

(73) Assignee: NEC Lighting, Ltd., Tokyo (JP)

( * ) Notice: Subject to any disclaimer, the term of this patent is extended or adjusted under 35 U.S.C. 154(b) by 0 days.

(21) Appl. No.: 13/697,678

(22) PCT Filed: Apr. 26, 2011

(86) PCT No.: PCT/JP2011/060116
§ 371 (c)(1),
(2), (4) Date: Nov. 13, 2012

(87) PCT Pub. No.: WO2011/142248
PCT Pub. Date: Nov. 17, 2011

(65) Prior Publication Data
US 2013/0056721 A1    Mar. 7, 2013

(30) Foreign Application Priority Data

May 14, 2010    (JP) ................................ 2010-112076

(51) Int. Cl.
*H01L 29/08*    (2006.01)
*H01L 35/24*    (2006.01)
*H01L 51/00*    (2006.01)

(52) U.S. Cl.
USPC ........................................................ 257/40

(58) Field of Classification Search
USPC ............... 257/40, 74, 81, 82, 91, 98, 99, 100, 257/116, 117, 432–437, 749, 257/E33.056–E33.059, E25.032, 88, 257/E21.503; 438/25–28
See application file for complete search history.

(56) References Cited

U.S. PATENT DOCUMENTS

| 7,034,470 B2 * | 4/2006 | Cok et al. ...................... 315/249 |
| 8,148,725 B2 * | 4/2012 | Chen et al. ...................... 257/59 |
| 8,487,530 B2 * | 7/2013 | Nomura ........................ 313/506 |
| 2002/0190661 A1 * | 12/2002 | Duggal et al. ............. 315/169.1 |
| 2004/0032220 A1 * | 2/2004 | Cok et al. ...................... 315/291 |

(Continued)

FOREIGN PATENT DOCUMENTS

| JP | 2004-234868 | 8/2004 |
| JP | 2007-200577 | 8/2007 |

(Continued)

OTHER PUBLICATIONS

English Abstract of International Publication No. WO 2006/002519 A1, dated Jan. 12, 2006 (corresponding to JP 2008-504654).

(Continued)

*Primary Examiner* — Dao H Nguyen
*Assistant Examiner* — Tram H Nguyen
(74) *Attorney, Agent, or Firm* — Scully, Scott, Murphy & Presser, P.C.

(57) ABSTRACT

In the organic EL illumination device including m (m is an integer greater than 1) series circuits each of which includes n (n is an integer greater than 1) organic EL panels connected in series, each of the organic EL panels is provided with one organic EL element, a positive electrode and a negative electrode, the m series circuits are connected in parallel between the positive electrode and the negative electrode, and among the organic EL panels in the m series circuits, the organic EL panels having the same place in series connections in the direction from the positive electrode to the negative electrode are connected with each other in parallel.

2 Claims, 10 Drawing Sheets

(56) References Cited

U.S. PATENT DOCUMENTS

| | | | | |
|---|---|---|---|---|
| 2008/0001512 | A1* | 1/2008 | Nomura | 313/307 |
| 2013/0015768 | A1* | 1/2013 | Roberts et al. | 315/122 |
| 2013/0285033 | A1* | 10/2013 | Nishikawa et al. | 257/40 |

FOREIGN PATENT DOCUMENTS

| | | |
|---|---|---|
| JP | 2008-504654 | 2/2008 |
| JP | 2008-535240 | 8/2008 |
| JP | 2010-140644 | 6/2010 |
| WO | WO 2009/119275 A1 | 10/2009 |

OTHER PUBLICATIONS

English Abstract of International Publication No. WO 2006/104544 A1, dated Oct. 5, 2006 (corresponding to JP 2008-535240).

International Search Report dated May 24, 2011 issued in PCT/JP2011/060116.

\* cited by examiner

ORGANIC EL ILLUMINATION DEVICE

TECHNICAL FIELD

The present invention relates to an organic EL (electroluminescence) illumination device.

BACKGROUND ART

An organic EL element or an organic EL section in an organic EL panel or the like includes an anode such as a transparent electrically-conducting layer, a cathode formed by using a metal thin layer such as aluminum and a luminescent layer including organic material. The luminescent layer is provided as a membrane later between the anode and the cathode (see Patent Literature 1).

When, in the organic EL section, an electric field is generated between the anode and the cathode by applying a voltage therebetween, a hole that is a carrier is injected from the anode into the luminescent layer, and an electron that is a carrier is injected from the cathode into the luminescent layer. The electron and hole are recombined with each other in the luminescent layer to produce luminescence.

The thickness of the layer (membrane) between the anode and the cathode in the organic EL section is as very thin, in the order of a nano millimeter. Accordingly, even if a low voltage is applied between the anode and the cathode, an electric field to be produced between the anode and the cathode becomes high. Therefore, the organic EL section including a very thin layer (membrane) between the anode and the cathode can be driven using a low voltage of a few volts.

CITATION LIST

Patent Literature

Patent Literature 1: JP2008-535240A

SUMMARY OF INVENTION

Technical Problem

An organic EL section is a very thin element. Accordingly, if an electric field is not uniformly generated because there is a foreign substance between the anode and cathode or if there is any unevenness in the thin layer, then a short circuit is likely to occur between the anode and the cathode. A short circuit between the anode and the cathode contributes to preventing organic EL illumination from being used.

Also, in the organic EL section, a supply-voltage overshoot or undershoot that occurs when the power is turned off or on causes an excessive amount of voltage between the anode and the cathode. Accordingly, the organic EL section, unfortunately, may be broken (a short circuit or an open-circuit condition).

In addition, if the anode in the organic EL section is mistakenly connected to the low potential side of a supply voltage and the cathode in the organic EL section is connected to the high potential side of the supply voltage, a voltage is applied to the organic EL section in an inversely-biased manner, thus causing a problem in which the organic EL section is broken.

When the organic EL section is used for a product in the illumination field, a short circuit between the anode and the cathode is one of the key problems. Particularly in an organic EL illumination device (an organic EL luminaire) including a plurality of organic EL panels each of which has one organic EL element provided on one substrate (hereinafter, called an "unit organic EL panel"), there is a high possibility that a short circuit will occur due to the large luminescent area and the large area to which an electric field is applied, resulting in a reduced yield and lowered reliability.

In the organic EL illumination device including a plurality of unit organic EL panels, the unit organic EL panels are generally connected in series. Alternatively, the unit organic EL panels may be connected in parallel for the purpose of lowering the drive voltage or controlling each of the unit organic EL panels.

When the unit organic EL panels are connected in series, if any one of the unit organic EL panels has a short-circuit between the anode and the cathode therein, then the only unit organic EL panel that will not send out light in the panel that has a short circuit, and if any one of the unit organic EL panels has an open-circuit between the anode and the cathode therein, none of the unit organic EL panels connected in series will send out light.

In contrast, when the unit organic EL panels are connected in parallel, if any one of the unit organic EL panels has a short-circuit between the anode and the cathode therein, then none of the unit organic EL panels connected in parallel will send out light because of concentration of the electric current in a place where the short circuit occurred, and if any one of the unit organic EL panels has an open-circuit between the anode and the cathode therein, then the only unit organic EL panel which has an open-circuit will not send out light.

In sum, the organic EL illumination device including a plurality of unit organic EL panels connected in series or in parallel has a problem in which none of the unit organic EL panels, which are connected with each other, will send out light because of occurrence of a short circuit or an open circuit.

Therefore, an object of the present invention is to provide an organic EL illumination device that successfully overcomes the problem described above.

Solution to Problem

An organic EL illumination device according to the present invention includes m (m is an integer greater than 1) series circuits each of which includes n (n is an integer greater than 1) organic EL panels connected in series, each of the organic EL panels being provided with one organic EL element, a positive electrode and a negative electrode, in which said m series circuits are connected in parallel between said positive electrode and said negative electrode, and among the organic EL panels in said m series circuits, the organic EL panels having the same place in series connections in the direction from said positive electrode to said negative electrode are connected with each other in parallel.

Advantageous Effect of Invention

According to the present invention, in an organic EL illumination device including a plurality of organic EL panels connected with each other, each of which is provided with one organic EL element, all of the organic EL panels can be prevented from sending out light even if an organic EL element has a short circuit or an open circuit.

DESCRIPTION OF EMBODIMENTS

Exemplary embodiments will be described below with reference to the drawings.

(First Exemplary Embodiment)

Figure 1:
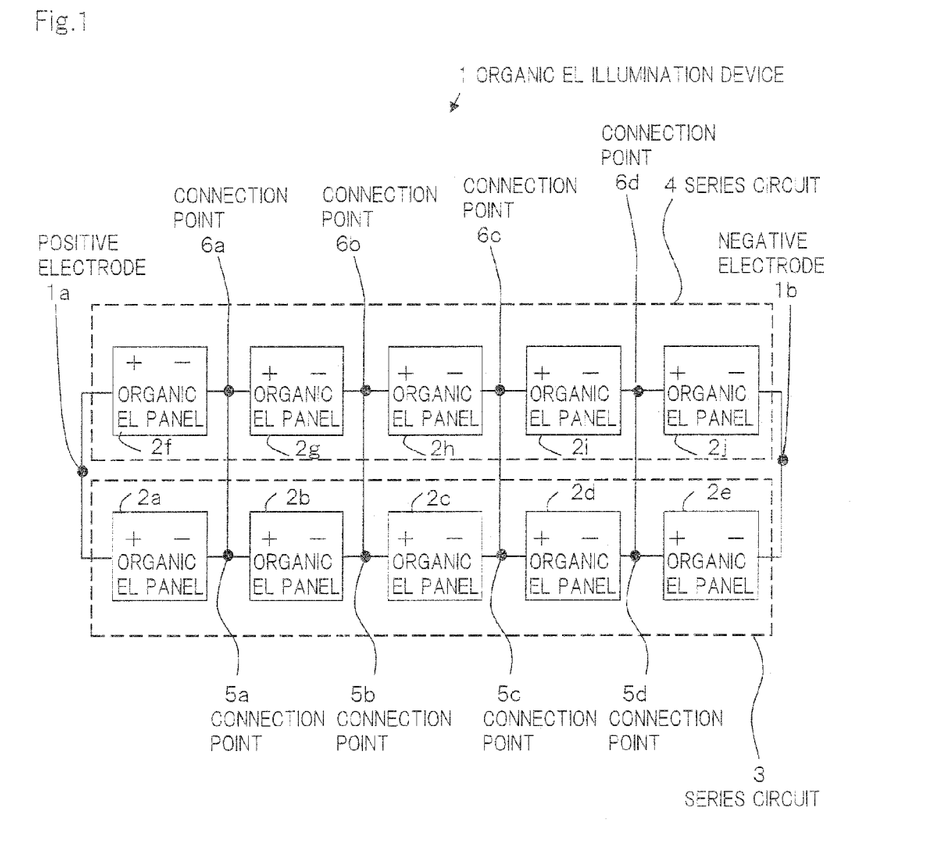
FIG. 1 illustrates organic EL illumination device 1 according to a first exemplary embodiment.

FIG. 1 illustrates organic EL illumination device 1 according to a first exemplary embodiment.

In FIG. 1, organic EL illumination device 1 includes positive electrode 1a, negative electrode 1b and "n×m" organic EL panels 2a to 2j. It is noted that n is an integer greater than 1 and m is an integer greater than 1. FIG. 1 illustrates an example where n=5 and m=2. It is noted that n is not limited to 5, and m is not limited to 2.

Each of organic EL panels 2a to 2j is provided with one organic EL element. In this exemplary embodiment, organic EL panels 2a to 2j have the same configuration.

Figure 2A:
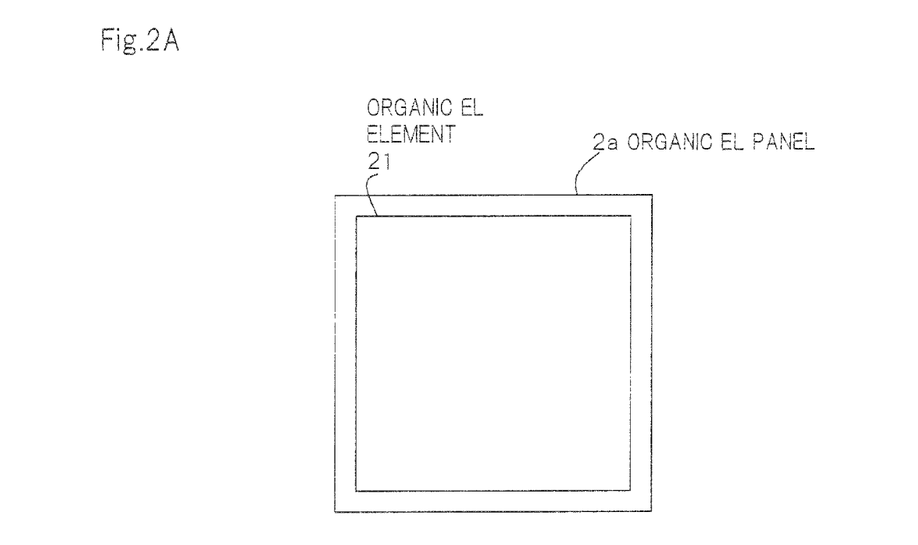
FIG. 2A illustrates one example of an organic EL panel.
Figure 2B:
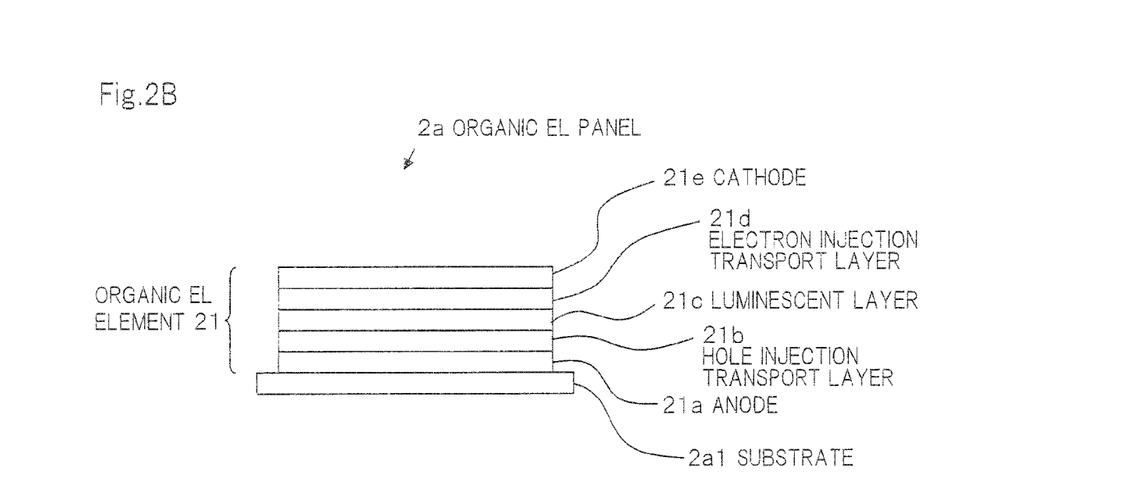
FIG. 2B illustrates one example of the organic EL panel.

FIGS. 2A and 2B illustrate one example of organic EL panel 2a.

In FIGS. 2A and 2B, organic EL panel 2a includes substrate 2a1 such as glass, and organic EL element 21. Organic EL element 21 includes anode 21a provided on substrate 2a1, hole injection transport layer 21b provided on anode 21a, luminescent layer 21c provided on hole injection transport layer 21b, electron injection transport layer 21d provided on luminescent layer 21c, and cathode 21e provided on electron injection transport layer 21d. Anode 21a is a transparent, electrically-conducting layer (for example, ITO: Indium Tin Oxide). Cathode 21e is a metal, thin layer such as aluminum. Luminescent layer 21c includes organic material.

Each of the ends shown by "+" among ends of organic EL panels 2a to 2j is provided with a terminal connected to anode 21a, and each of the ends shown by "−" among the ends of organic EL panels 2a to 2j is provided with a terminal connected to cathode 21e.

Organic EL illumination device 1 includes series circuits 3 and 4. In series circuit 3, organic EL panels 2a to 2e are connected in series, and in series circuit 4, organic EL panels 2f to 2j are connected in series. It is noted that in series circuits 3 and 4, each of organic EL panels 2, that is, each of the organic EL elements is connected in series in the forward direction.

In this exemplary embodiment, n (5) organic EL panels connected in series are used as one set. For example, the n organic EL panels connected in series are integrated and the integrated series circuit is used as one set. It is noted that the n organic EL panels connected in series may not be integrated.

Series circuit 3 and series circuit 34 are connected in parallel between positive electrode 1a and negative electrode 1b. Furthermore, series circuit 3 and series circuit 4 are connected in parallel in the forward direction between positive electrode 1a and negative electrode 1b.

Also, among the organic EL panels in series circuit 3 and series circuit 4, the organic EL panels including the same place in series connections in the direction from positive electrode 1a to negative electrode 1b are connected with each other in parallel in the forward direction.

In the example illustrated in FIG. 1, for example, organic EL panel 2a and organic EL panel 2f are connected with each other in parallel in the forward direction, and organic EL panel 2b and organic EL panel 2g are connected with each other in parallel in the forward direction.

In this exemplary embodiment, respective connection points 5a to 5d of organic EL panels 2a to 2e in series circuit 3 are connected on a one-to-one basis with respective connection points 6a to 6d of organic EL panels 2f to 2j in series circuit 4.

Figure 3:
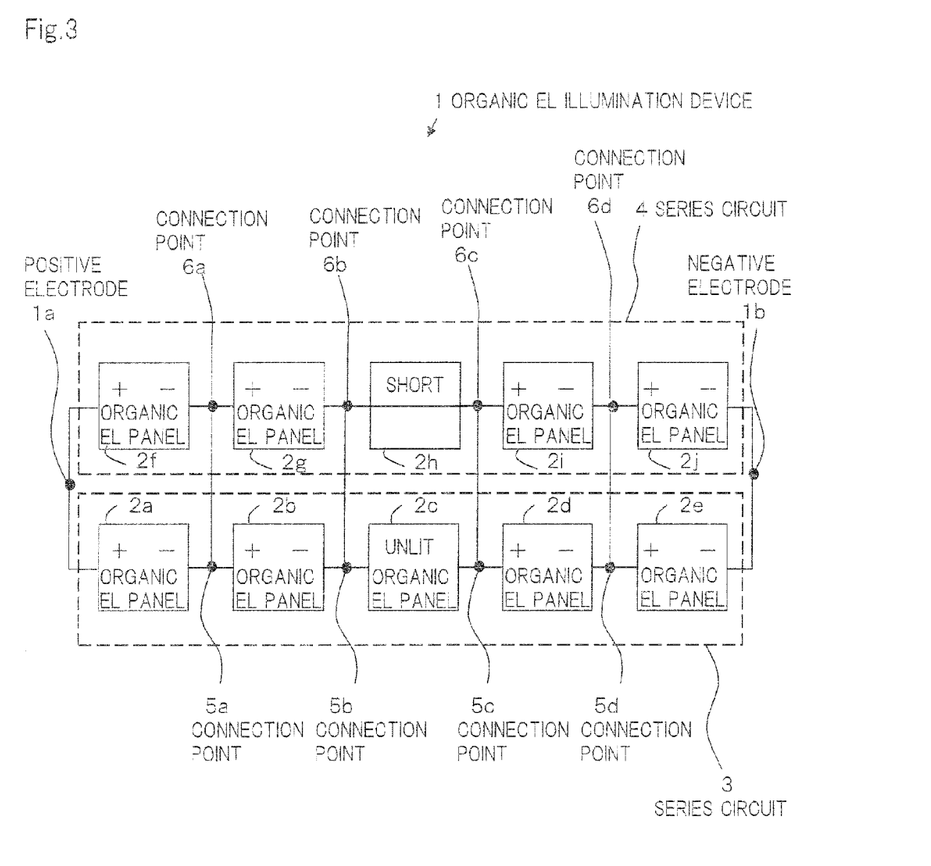
FIG. 3 illustrates an example where organic EL panel 2h has a short circuit in organic EL illumination device 1 illustrated in FIG. 1.

FIG. 3 illustrates an example where organic EL panel 2h has a short circuit in organic EL illumination device 1 illustrated in FIG. 1.

Referring to FIG. 3, even if an organic EL panel (for example, organic EL panel 2h) has a short circuit between the anode and the cathode therein, the organic EL panel (organic EL panel 2c) connected in parallel with the organic EL panel having a short circuit does not send out light, but the organic EL panels (organic EL panels 2f, 2g, 2i and 2j) connected in series with the organic EL panel having a short circuit can continue to send out light.

Figure 4:
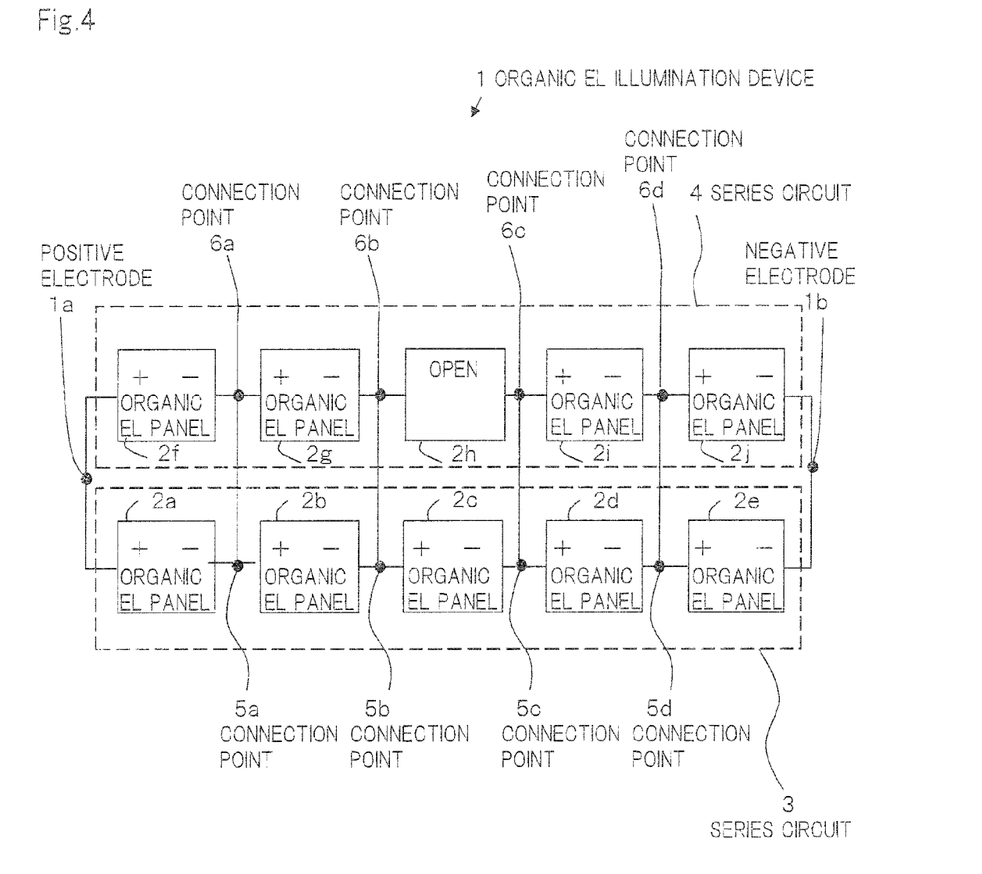
FIG. 4 illustrates an example where organic EL panel 2h becomes open between the anode and the cathode therein in organic EL illumination device 1 illustrated in FIG. 1.

FIG. 4 illustrates an example where organic EL panel 2h becomes open between the anode and the cathode therein (an open, for example, by breaking of wire) in organic EL illumination device 1 illustrated in FIG. 1.

Referring to FIG. 4, even if an organic EL panel (for example, organic EL panel 2h) becomes open between the anode and the cathode therein, the organic EL panels other than this panel can continue to send out light.

According to this exemplary embodiment, in organic EL illumination device 1 including m series circuits each of which includes n organic EL panels connected in series, each of the organic EL panels is provided with one organic EL element, positive electrode 1a and negative electrode 1b, the m series circuits are connected in parallel between positive electrode 1a and negative electrode 1b, and among the organic EL panels in the m series circuits, the organic EL panels having the same place in series connections in the direction from positive electrode 1a to negative electrode 1b are connected with each other in parallel.

Accordingly, even if any organic EL panel in organic EL illumination device 1 has a short circuit between the anode and the cathode therein, the organic EL panel connected in parallel with the organic EL panel having a short circuit does not send out light, but the organic EL panels connected in series with the organic EL panel having a short circuit can continue to send out light. In addition, even if any organic EL panel in organic EL illumination device 1 has an open circuit between the anode and the cathode therein, the organic EL panels other than this panel can continue to send out light.

Therefore, a short circuit or an open circuit between the anode and the cathode in one organic EL panel of "n×m" organic EL panels can be prevented from causing all organic EL panels from not being able to send out light, and further, deterioration can be minimized in the case of a failure.

Figure 5:
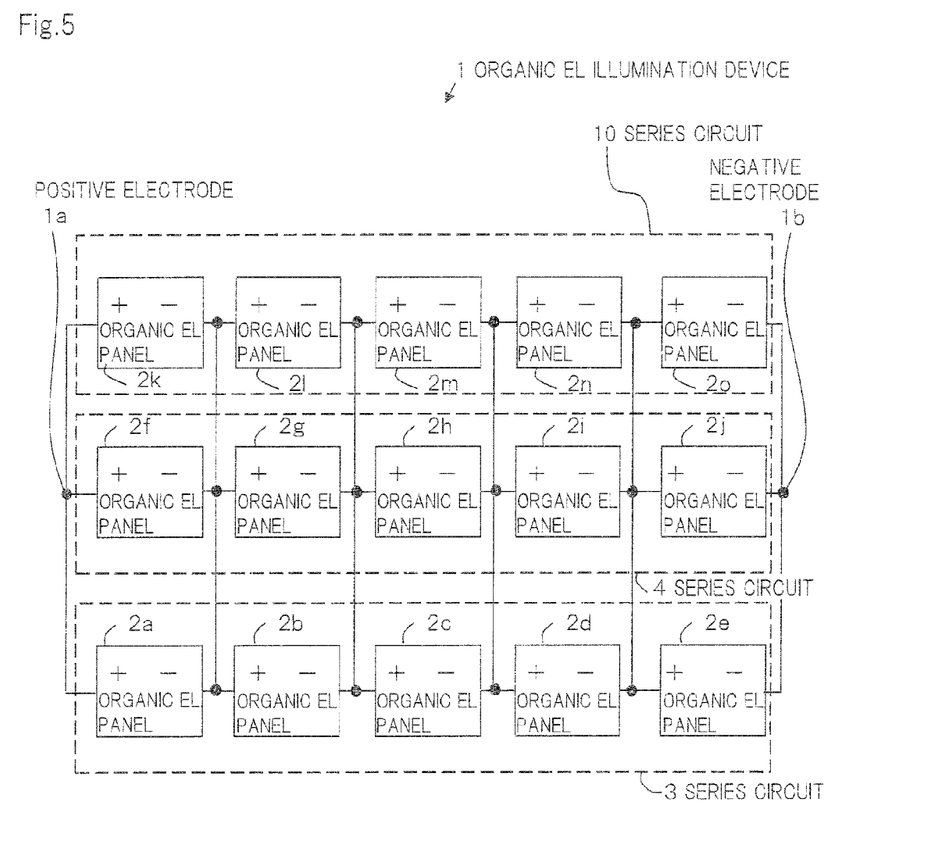
FIG. 5 illustrates a modification of organic EL illumination device 1 illustrated in FIG. 1.
Figure 6:
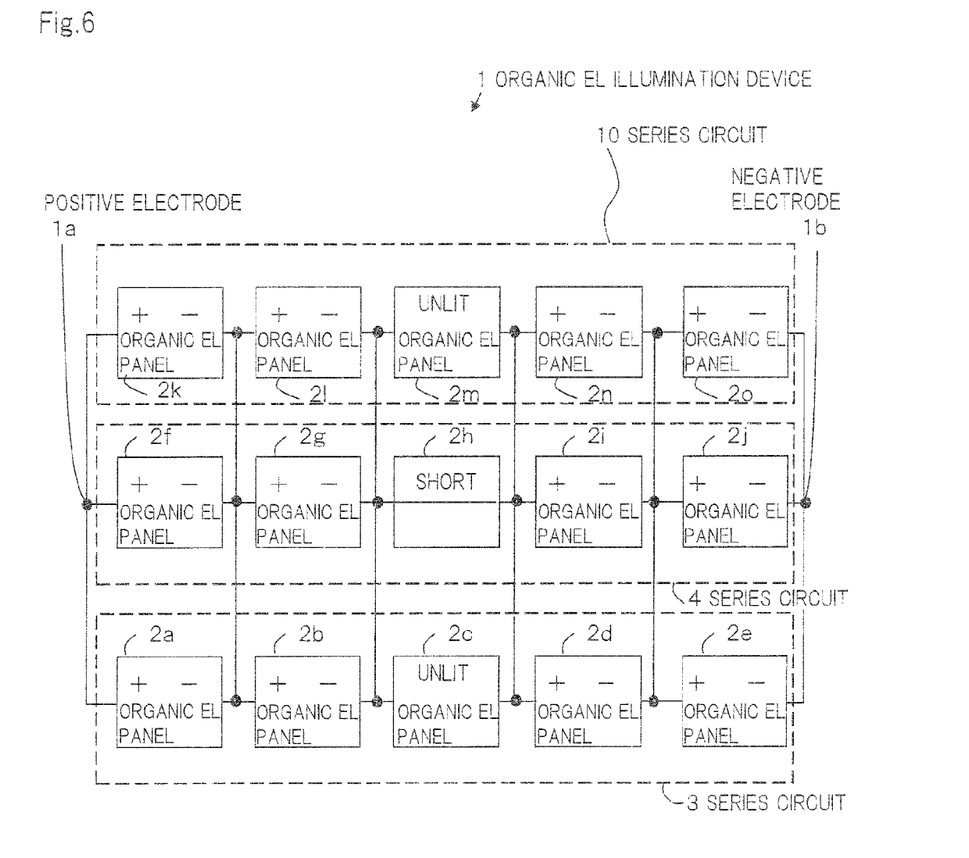
FIG. 6 illustrates another modification of organic EL illumination device 1 illustrated in FIG. 1.
Figure 7:
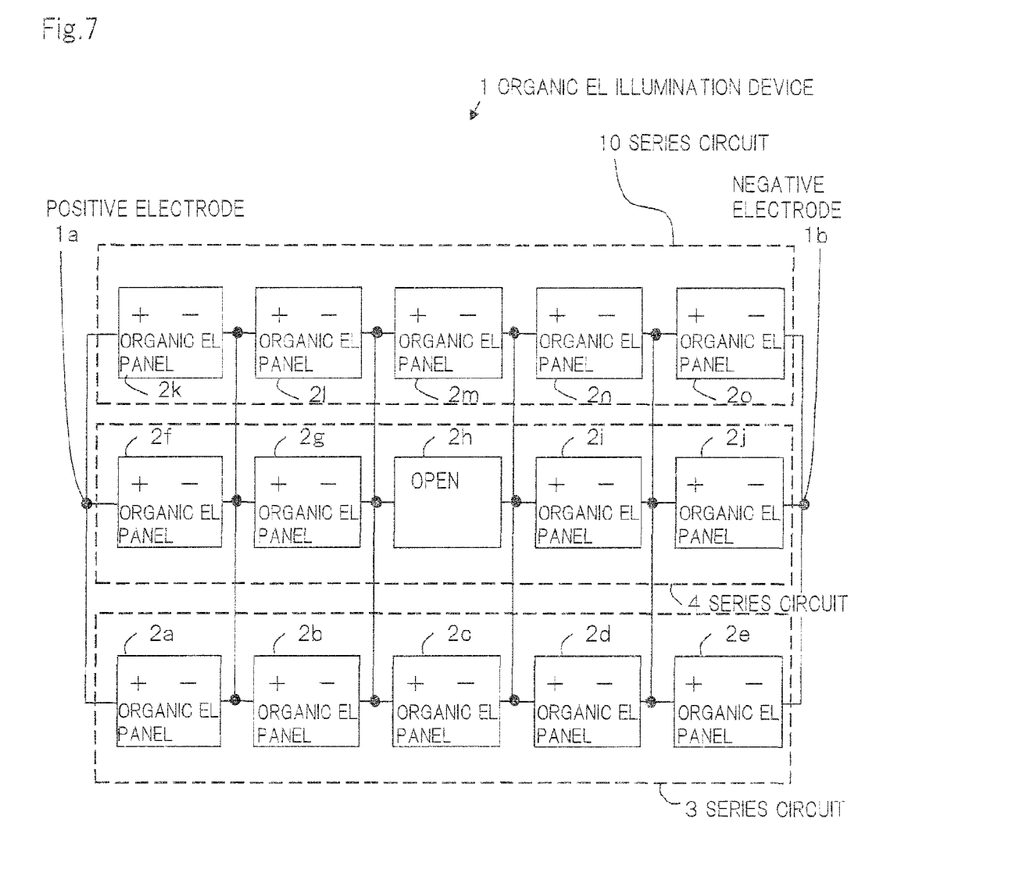
FIG. 7 illustrates yet another modification of organic EL illumination device 1 illustrated in FIG. 1.

FIGS. 5 to 7 illustrate modifications of organic EL illumination device 1 illustrated in FIG. 1. It is noted that in FIGS. 5 to 7, elements having the same configuration as those illustrated in FIG. 1 are given like symbols. In the first exemplary embodiment, n is set to 5 and m to 2, but in FIGS. 5 to 7, n is set to 5 and m to 3.

Accordingly, in the modifications illustrated in FIGS. 5 to 7, to organic EL illumination device 1 illustrated in FIG. 1, series circuit 10 is added in which organic EL panels 2k to 2o are connected in series in the forward direction. Further, organic EL panels 2a, 2f and 2k are connected in parallel in the forward direction. Organic EL panels 2b, 2g and 2l are connected in parallel in the forward direction. Organic EL panels 2c, 2h and 2m are connected in parallel in the forward direction. Organic EL panels 2d, 2i and 2n are connected in parallel in the forward direction. Organic EL panels 2e, 2j and 2o are connected in parallel in the forward direction.

These modifications also have a similarly advantageous effect as the first exemplary embodiment. It is noted that the greater the increase in the number of organic EL panels, the smaller is the occurrence of a change in forward current according to the occurrence of organic EL panels that have a short circuit or an open circuit, and a brightness change thus becomes smaller, which can reduce the effect on illumination caused by the occurrence of an organic EL panel having a short circuit state or an open circuit state.

(Second Exemplary Embodiment)

Figure 8:
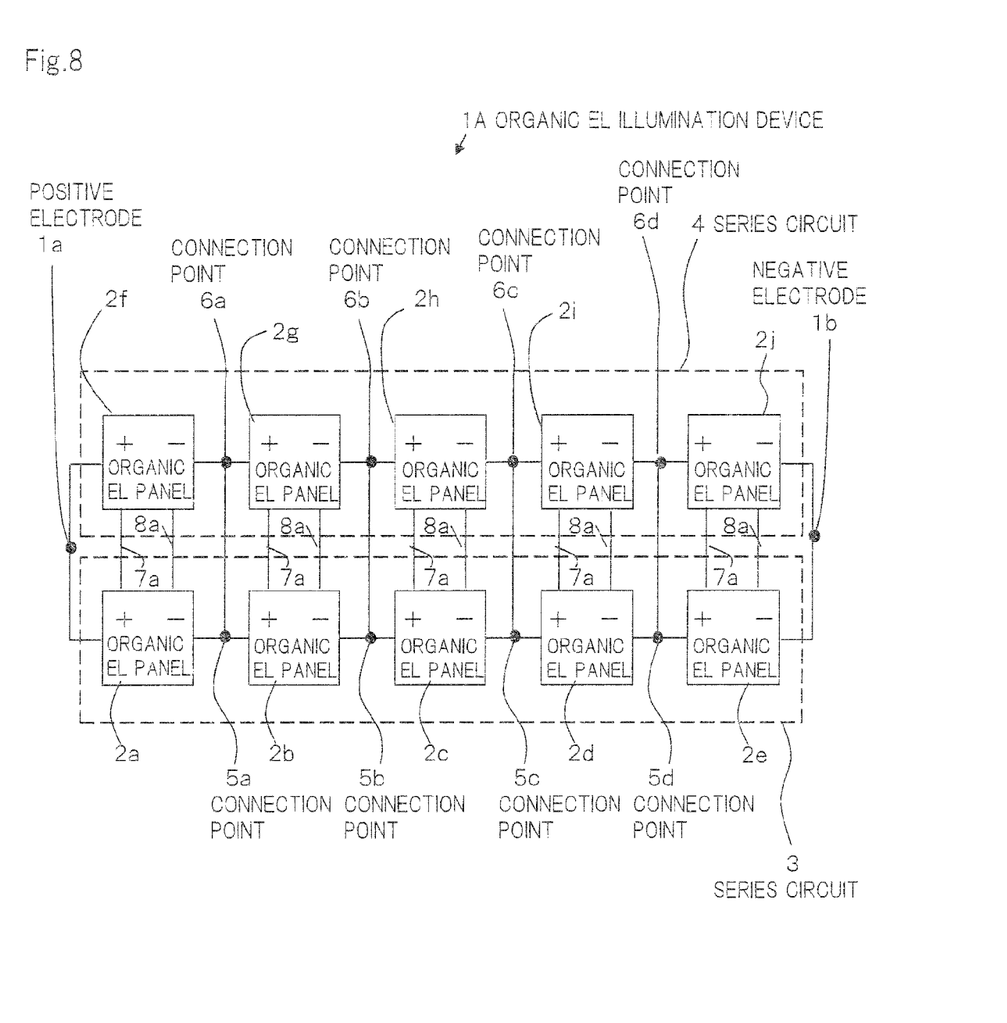
FIG. 8 illustrates organic EL illumination device 1A according to a second exemplary embodiment.

FIG. 8 illustrates organic EL illumination device 1A according to a second exemplary embodiment. It is noted that in FIG. 8, elements having the same configuration as those illustrated in FIG. 1 are given like symbols.

In FIG. 8, the second exemplary embodiment differs from the first exemplary embodiment in that between the organic EL panels connected with each other in parallel, the anodes are connected with each other by connection lines 7a that are electrically conducting lines, and the cathodes are connected with each other by connection lines 8a that are electrically conducting lines.

Figure 9:
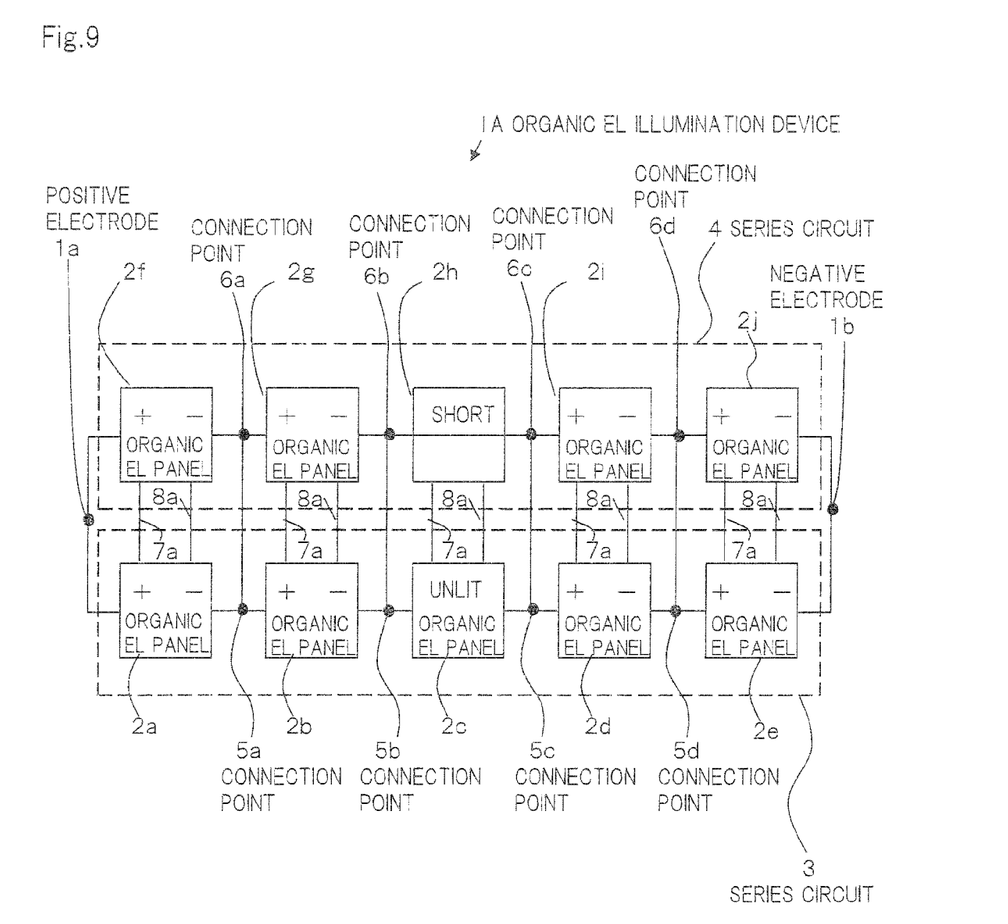
FIG. 9 illustrates an example where organic EL panel 2h has a short circuit in organic EL illumination device 1A illustrated in FIG. 8.

FIG. 9 illustrates an example where organic EL panel 2h has a short circuit in organic EL illumination device 1A illustrated in FIG. 8.

Referring to FIG. 9, even if an organic EL panel (for example, organic EL panel 2h) has a short circuit between the anode and the cathode therein, the organic EL panel (organic EL panel 2c) connected in parallel with the organic EL panel having a short circuit does not send out light, but the organic EL panels (organic EL panels 2f, 2g, 2i and 2j) connected in series with the organic EL panel having a short circuit can continue to send out light.

Figure 10:
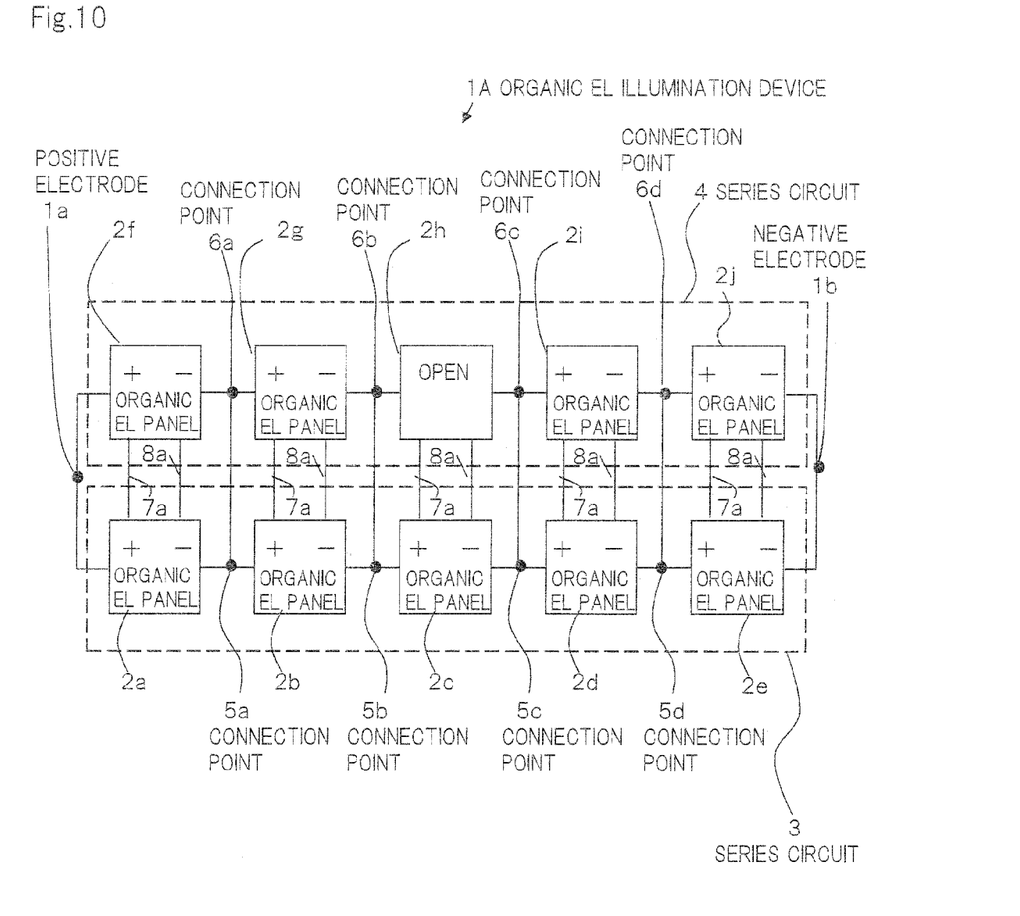
FIG. 10 illustrates an example where organic EL panel 2h becomes open between the anode and the cathode therein in organic EL illumination device 1A illustrated in FIG. 8.

FIG. 10 illustrates an example where organic EL panel 2h has an open circuit between the anode and the cathode therein (an open-circuit condition, for example, by a broken wire) in organic EL illumination device 1A illustrated in FIG. 8.

Referring to FIG. 10, even if an organic EL panel (for example, organic EL panel 2h) has an open circuit between the anode and the cathode therein, the organic EL panels other than this panel can continue to send out light.

In this exemplary embodiment, between the organic EL panels connected with each other in parallel, the anodes are connected with each other, and the cathodes are connected with each other. Accordingly, the potential is equally produced between the organic EL panels connected with each other in parallel, and unevenness in brightness and chromaticity can be thus reduced, and at the same time, electrical charges are more dispersed, so that a panel failure, such as a short circuit and an open circuit, which may be caused by rush current produced by an electric field in the forward or reverse direction, can be accordingly prevented from occurring when power is turned on/off, or the like.

Although the invention of the application has been described above with reference to the exemplary embodiments, the invention of the application is not limited to the exemplary embodiments described above. A variety of modifications that persons skilled in the art can appreciate may be made to configurations and details of the invention of the application within the scope thereof.

This application claims the benefit of Japanese Patent Application No. 2010-112076 filed on May 14, 2010, the disclosure of which is incorporated herein in its entirety by reference.

Reference Signs List 1, 1A organic EL illumination device
2a to 2o organic EL panel
3, 4, 10 series circuit
5a to 5d connection point
6a to 6d connection point
7a, 8a connection line

What is claimed is:

1. An organic EL illumination device, comprising:
   m (m is an integer greater than 1) series circuits each of which includes n (n is an integer greater than 1) organic EL panels connected in series, each of the organic EL panels being provided with one organic EL element,
   a positive electrode, and
   a negative electrode, wherein,
   said m series circuits are connected in parallel between said positive electrode and said negative electrode, and
   the organic EL panels that are positioned in the same location in series connections in the direction from said positive electrode to said negative electrode in respective circuits of the m series circuits, are connected with each other in parallel.

2. The organic EL illumination device according to claim 1, wherein,
   said organic EL element includes an anode, a cathode, and a luminescent layer provided between said anode and said cathode, and
   between said organic EL panels connected with each other in parallel, said anodes are connected with each other, and said cathodes are connected with each other.

* * * * *